United States Patent
Kasapi et al.

(10) Patent No.: US 7,679,358 B2
(45) Date of Patent: Mar. 16, 2010

(54) SYSTEM AND METHOD FOR VOLTAGE NOISE AND JITTER MEASUREMENT USING TIME-RESOLVED EMISSION

(75) Inventors: Steven Kasapi, San Francisco, CA (US); Gary Leonard Woods, Sunnyvale, CA (US)

(73) Assignee: DCG Systems, Inc., Fremont, CA (US)

( * ) Notice: Subject to any disclaimer, the term of this patent is extended or adjusted under 35 U.S.C. 154(b) by 265 days.

(21) Appl. No.: 11/697,205

(22) Filed: Apr. 5, 2007

(65) Prior Publication Data

US 2007/0236206 A1    Oct. 11, 2007

Related U.S. Application Data

(60) Provisional application No. 60/744,329, filed on Apr. 5, 2006.

(51) Int. Cl.
  *G01R 31/16* (2006.01)
(52) U.S. Cl. .................... 324/158.1; 324/76.22
(58) Field of Classification Search .......... None
  See application file for complete search history.

(56) References Cited

U.S. PATENT DOCUMENTS

| | | | |
|---|---|---|---|
| 6,327,394 B1 * | 12/2001 | Kash et al. ............... | 382/280 |
| 6,369,601 B1 | 4/2002 | Ishigaki | |
| 6,483,327 B1 * | 11/2002 | Bruce et al. ............... | 324/752 |
| 6,813,578 B1 | 11/2004 | Ng | |
| 6,859,031 B2 | 2/2005 | Pakdaman et al. | |
| 6,976,234 B2 * | 12/2005 | Kasapi ..................... | 716/6 |
| 7,012,537 B2 * | 3/2006 | Woods et al. ............. | 340/635 |
| 2003/0146761 A1 * | 8/2003 | Pakdaman et al. ....... | 324/501 |

OTHER PUBLICATIONS

International Search Report for PCT/US07/08607 dated Feb. 25, 2008.

* cited by examiner

*Primary Examiner*—Vinh P Nguyen
(74) *Attorney, Agent, or Firm*—Nixon Peabody LLP.; Joseph Bach, Esq.

(57) ABSTRACT

Time-resolved emission can be used to measure loop-synchronous, small-signal voltage perturbation in integrated circuits. In this technique the measurements are completely non-invasive and so reflect the true device behavior. The time-dependant propagation delay caused by Vdd modulation also shows the expected qualitative signature. This technique should find applications in circuits with relatively fast clock-like circuits where loop-synchronous voltage pickup is limiting circuit behavior.

13 Claims, 5 Drawing Sheets

SYSTEM AND METHOD FOR VOLTAGE NOISE AND JITTER MEASUREMENT USING TIME-RESOLVED EMISSION

RELATED APPLICATIONS

This application claims priority from Provisional Application Ser. No. 60/744,329, filed Apr. 5, 2006, the entire content thereof is incorporated herein by reference.

BACKGROUND

1. Field of the Invention

This invention relates to time-resolved emission for timing and voltage measurement. More specifically, this invention relates to using time-resolved emission to measure timing perturbation and voltage modulation signals inside an integrated circuit.

2. Description of Related Art

Time-resolved emission (TRE) is commonly used for circuit debug and advanced timing-related failure analysis. Established application areas include localization of resistive interconnects, timing contention, circuit debug, clock distribution skew analysis, and other timing-related fault isolation techniques.

The basic concepts of time-resolved emission have been covered extensively in the prior art. The carriers responsible for the source-drain current in a transistor can emit photons if they are sufficiently excited. Some of these photons are in an energy band which can be detected by time-resolved single-photon detectors. When a normally-operating gate in a properly designed CMOS circuit switches, the carriers are briefly saturated and thus have an elevated probability of emitting a detectable infra-red photon. These photons are accumulated by a time-resolved system to measure the timing behavior of a device. The probability of detecting a photon in a single switching event is small, so the stimulus is looped many times and the photons time stamps are relative to the start of the loop.

Circuit jitter limits the performance of many high-speed circuits. Jitter can limit bit error rate (BER) in serial communication circuits, including PCI Express, Serial ATA, Gigabit Ethernet, and InfiniBand. It also limits the clock frequency of microprocessors, advanced chipsets, graphics processors, and other circuits relying on phase-locked loops (PLLs) and clock distribution networks.

Conventional electrical jitter measurements on internal nodes require gaining physical access to metal lines, often using focussed ion beam (FIB) to create access to a metal line contact point, and an electrical probe of some kind to make mechanical ohmic contact to that contact point. While such measurement enable real-time measurements of jitter timing, the mechanical probing process can load a circuit so much that it alters the electrical behavior of the circuit. For example, a typical gate capacitance is less than 10 fF/μm width, while even a very small mechanical probe can have capacitance of 0.02 to 0.5 pF, i.e, significantly larger than the gate capacitance.

Another prior art technique is to use design-for-test (DFT) features to induce or measure time-dependant voltage information. This is possible in some cases, but the high area penalty precludes its use except for a few nodes. Further, nodes which have been designed carefully using DFT features are not the ones that require extensive debug. Thus, non-invasive jitter measurements can be quite valuable.

The source of timing jitter is local voltage noise. The voltage noise is either random (such as Nyquist noise caused by local impedance) or is deterministic (caused by pickup from another part of the circuit). Deterministic noise is either asynchronous with the test loop (caused by a voltage noise source uncorrelated with the stimulus) or is synchronous. Both asynchronous and random jitter widen the peaks detected by the TRE system because the TRE system requires many loops to acquire a timing signal. On the other hand, deterministic, synchronous jitter causes a variation in the timing delay between TRE peaks, but not broadening of the peaks.

Improved means are needed in the art to enable non-invasive measurement of dynamic local power supply voltage variations and synchronous timing jitter induced by the voltage variations.

SUMMARY

The following summary of the invention is provided in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Aspects of the invention solves problems in the prior art by providing means enabling non-invasive measurement of dynamic local power supply voltage variations and synchronous timing jitter induced by the voltage variations.

Various aspects of the invention provide method and system for measuring deterministic jitter and the local voltage variation causing it. This invention provides a new application of time-resolved emission to measure loop-synchronous circuit timing variation and small-signal voltage perturbation completely non-invasively.

Various aspects of the invention relate to a method for measuring local voltage variation in an integrated circuit and related device response, the method comprising: repeatedly stimulating the integrated circuit with a test loop; non-invasively acquiring a plurality of transition events from an integrated circuit while stimulating the integrated circuit; recording and measuring the positions in time, durations, and amplitudes of each of the transition events; and calculating the device response using at least one of the time, durations, and amplitude of a plurality of the transition events. The method may further comprise characterizing the amplitude of the transition events as a function of local voltage; and, tracing backwards from variations in amplitudes of the plurality of transition events to recover time-varying local voltage. The method may further comprise subtracting the position in time of a transition event acquired from two separate devices of the integrated circuit to thereby obtain propagation delay in the integrated circuit. The subtracting the position in time of a transition event acquired from two separate devices may be performed a plurality of time over successive transition events, to thereby obtain timing perturbation of the propagation delay. The method may further comprise displaying a plot of the timing perturbation of the propagation delay. The non-invasively acquiring a plurality of transition events may comprise detecting photon emission from selected devices of the integrated circuit. The non-invasively acquiring a plurality of transition events may comprise detecting modulation in light beam reflected from selected devices of the integrated circuit. The method may further comprise fitting a Gaussian curve to the plurality of transition events, and wherein the positions in time, durations, and amplitudes of each of the transition events comprises the timing, width, and amplitude of each peak of the Gaussian curve that corresponds to a transition event.

Aspects of the invention also relates to a method for measuring local voltage variation in an integrated circuit and related device response, the method comprising: repeatedly stimulating the integrated circuit with a test loop; acquiring photon emission corresponding to a plurality of transition events from selected device of the integrated circuit while stimulating the integrated circuit, to thereby obtain a photon emission signal; fitting a curve to the photon emission signal; recording and measuring the positions in time, durations, and amplitudes of each peak in the curve, wherein each peak correspond to a transition event; and calculating the local voltage variation using at least one of the time, durations, and amplitude of a plurality of peaks. The calculating the local voltage variation may comprise calculating changes in the amplitude of a plurality of successive peaks. The method may further comprise acquiring photon emission corresponding to a plurality of transition events from a second device of the integrated circuit while stimulating the integrated circuit, to thereby obtain a second photon emission signal; fitting a curve to the second photon emission signal; recording and measuring the positions in time, durations, and amplitudes of each peak in the second curve, wherein each peak correspond to a transition event; and calculating time perturbation in the integrated circuit using differences in position in time of the peaks of the curve and peaks of the second curve.

Aspects of the invention further relate to a system for measuring local voltage variation in an integrated circuit and related device response, the system comprising: a non-contact sensor for non-invasively acquiring a plurality of transition events from an integrated circuit and provide a transition events signal; a processor programmed to receiving the transition events signal and perform the operations: fitting a curve to the transition events signal; recording and measuring the positions in time, durations, and amplitudes of each peak in the curve, wherein each peak correspond to one of the transition events; and calculating the device response using at least one of the time, durations, and amplitude of a plurality of the transition events. The non-contact sensor may comprise a photon sensor. The non-contact sensor may operate to acquire a plurality of transition events from two selected devices of the integrated circuit and provide a first and a second transition events signals, and wherein the processor is further programmed to calculate time perturbation in the integrated circuit using differences in position in time of the peaks of curves of the first and second transition events signals.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1A is a block diagram of an embodiment of the invention, while

FIG. 6A is a close-up view of the data Gaussian peaks from inverter 17; while

DETAILED DESCRIPTION

The following is a detailed description of embodiments of the invention for measuring deterministic jitter and the local voltage variation causing it. One aspect of the invention is the use of a TRE system (or other non-invasive timing tool, such as the IDS 2000/2500 from Credence) to acquire transition events from an integrated circuit and apply new methodologies to the acquired signal to obtain the new measurements. According to embodiments of the invention, the device under test (DUT) is stimulated repeatedly by repeating a test loop a statistically significant number of times. The test loop can be provided by a tester or some other stimulus system capable of providing repeated stimulus loops. The response of a specific device to the stimulus is measured non-invasively, such as by photon emission system, laser tester, RF modulation, or the likes. The obtained signal is fitted into mathematical curve, such as Gaussian curves, so as to generate peaks corresponding to the stimulus events. The positions in time, durations, and amplitudes of these curves are measured and stored.

In the case of TRE, the variations in the areas of the peaks corresponding to the transitions are related to the voltage bias Vdd at the time of the transition. If Vdd is varying during the loop, the Vdd variation will cause an amplitude variation on the area of the peaks. By characterizing the emission of the switching transistor as a function of Vdd, the inventive method work backwards from the modulation of the peaks to recover the time-varying Vdd signal.

According to an embodiment of the invention, for LVP (laser voltage probe) and/or TRE data, the relative timing between nodes in the circuit is displayed. The display of this timing can be made as a time-delay graph between nodes.

Measuring Small Signal Voltage Perturbation Using TRE

The amplitude of the emission from a transistor is given by the equation:

$$N_{ph}(t) = \alpha \frac{I_S(t)}{q}(V_{DS}^*(t))e^{-\frac{\beta}{V_{DS}^*(t)}}$$

Where α and β are fitting constants and $V_{DS}^*$ is $$V_{DS}^*(t) = V_{DS}(t) - V_{DS,SAT}(t).$$

Both $I_S(t)$ and $V_{DS}^*(t)$ are functions of the device bias voltage, $V_{dd}^*(t)$ The total number of photons emitted during a switching event is $$N_{ph,sw}(V_{dd}) = \int_{t_0-\Delta t/2}^{t_0+\Delta t/2} N_{ph}(t)dt$$

where Δt is the interval around the switching event at time $t_0$. The total number of photons emitted by a switching transistor $N_{ph,sw}(V_{dd})$ is thus a strong exponential function of the bias voltage $V_{dd}$.

The Taylor expansion of $N_{ph,sw}(V_{dd})$ on $V_{dd}$ is $$N_{ph,sw}(V_{dd} + \Delta V_{dd}) = N_{ph,sw}(V_{dd}) + \Delta V_{dd} \frac{dN_{ph,sw}(V_{dd})}{dV_{dd}}.$$

Figure 12:
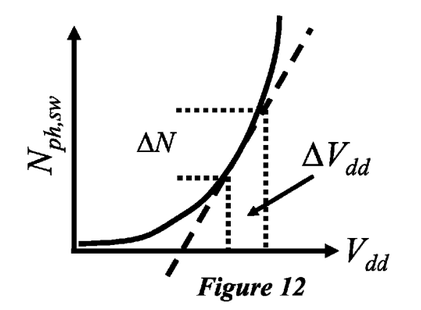
FIG. 12 is a plot illustrating the general emission response to voltage change.

If $N_{ph,sw}(V_{dd})$ is sufficiently linear in $V_{dd}$, we extrapolate the local voltage variation from the variation in the total number of photons emitted per switch. That is, while the emission response to $V_{dd}$ in general is not linear, for small variations, i.e., small range of $\Delta V_{dd}$ the emission response can be considered linear. This is illustrated in FIG. 12. Accordingly, if proper calibration is performed, as will be demonstrated below, then variations in $V_{dd}$ can be deduced from variation is the amplitude of the detected emission.

System Setup

Figure 1A:
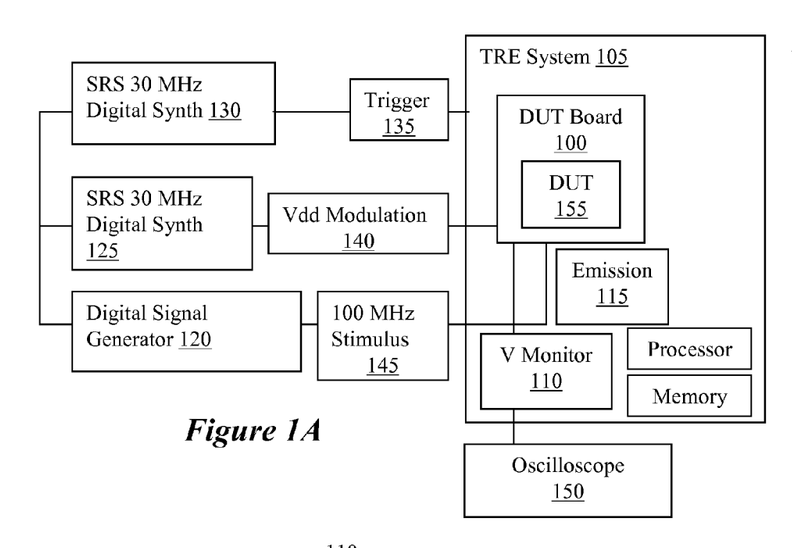
Figure 1B:
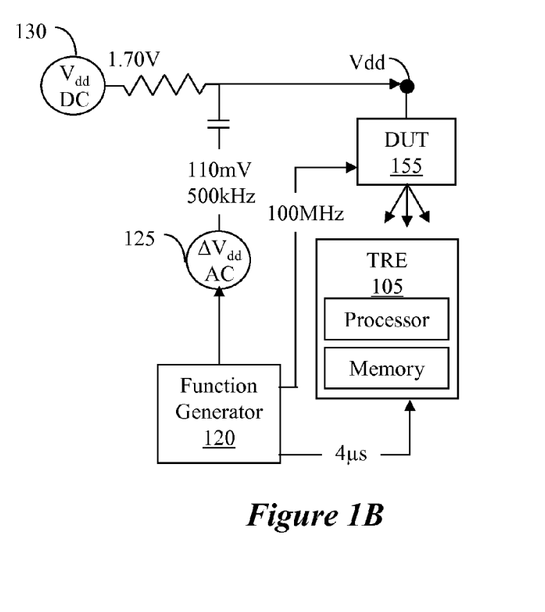
FIG. 1B provides an electrical schematic of FIG. 1A, used to test the inventive measurement method.

FIG. 1A is an illustration of an embodiment of the invention demonstrating the timing and small-signal voltage measurements using TRE, while FIG. 1B provides an electrical schematic of FIG. 1A. For the purpose of demonstrating TRE to measure local voltage and timing perturbation, a test circuit is used, into which a known Vdd perturbation is injected and the TRE is used to measure both the timing and the voltage perturbation.

In FIGS. 1A and 1B, a DUT 155 is mounted onto DUT board 100 in a conventional manner. The DUT board 100 is coupled to an emission system, such as a TRE system 105. TRE system 105 may be, for example, EmiScope®, available from Credence Systems, of Fremont, Calif. The TRE system 105 includes an emission detection system 115. The emission detection system 115 includes optics and photosensors arranged to detect photon emission from the DUT 155. Notably, while the description herein is related to testing done using TRE system, it should be understood that the invention is not limited to a TRE system, but rather other non-invasive system may be used without departing from the scope and spirit of the invention. One advantage of the invention is that the measurements are performed non-invasively, so as not to load the circuit under test (CUT) and, thereby potentially alter its response to the stimulus.

Figure 2A:
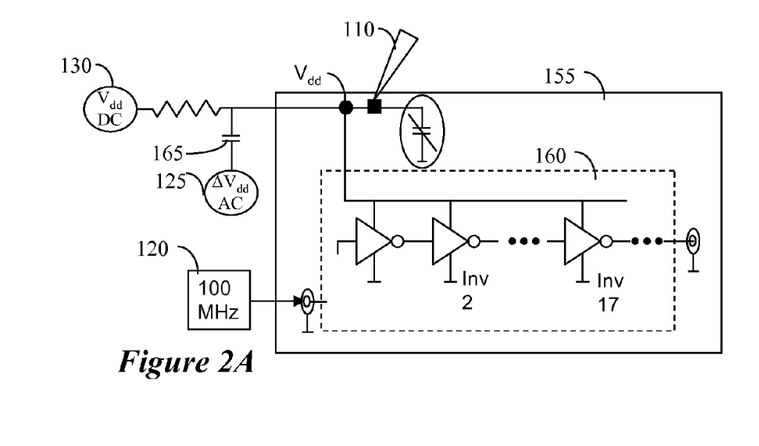
FIG. 2A illustrates a schematic of an inverter chain chip for demonstrating the invention.

FIG. 2A illustrates a schematic of a DUT having an inverter chain for demonstrating the invention. For this particular demonstration, the DUT 155 was an 0.18 μm process device and the circuit under test (CUT) 160 is an inverter chain with 20 inverters (Inv1-Inv20). The stimulus for the inverter chain was provided by a digital signal generator 120, which produced a 100 MHz square wave clock signal to drive the inverter chain. The 100 MHz signal produced TRE peaks, as will be discussed below. The peaks produced by inverters INV2 and INV17 are separate by a delay which depends on the time-varying bias voltage as:

$$V_{dd} + \frac{\Delta V_{dd}}{s}\sin(2\pi\nu t),$$

which was applied externally. In general, higher Vdd should leads to shorter gate delays and higher emission peaks. The digital signal generator 120 also provides a 10 MHz signal to phase lock two SRS digital function generators 125, 130. One function generator provided a synchronous trigger 135 to the TRE system 105 every two periods of the Vdd perturbation (250 KHz or 4 s period) or 40 periods of the 100 MHz square wave.

Figure 3:
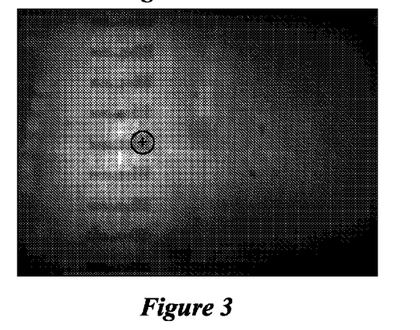
FIG. 3 is an optical InGaAs camera image of the DUT used for demonstrating the invention.

The voltage modulation signal 140 from the SRS function generator 125 was capacitively coupled to the Vdd of the test chip 100 as illustrated by capacitor 165. The source voltage was set at 1.70V, and the perturbations were set to 110 mV peak to peak, with a 500 KHz frequency, phase-locked to the 100 MHz signal. A separate DC-coupled voltage probe 110 monitored Vdd, mainly for test and verification of the inventive methodology. An optical InGaAs camera image of the DUT 100 is shown in FIG. 3, wherein the inverters are oriented vertically. The area from which photons were collected is indicated by the circle with the cross-hairs, near the middle of the image.

Figure 2B:
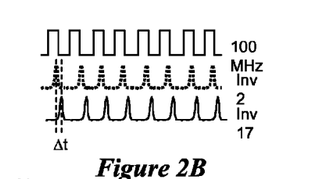
FIG. 2B illustrates the Gaussian emission peaks corresponding to the clock signal and FIG. 2C illustrates the Gaussian emission peaks corresponding to the Vdd modulation signal.
Figure 2C:
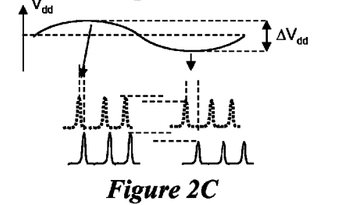
Figure 2D:
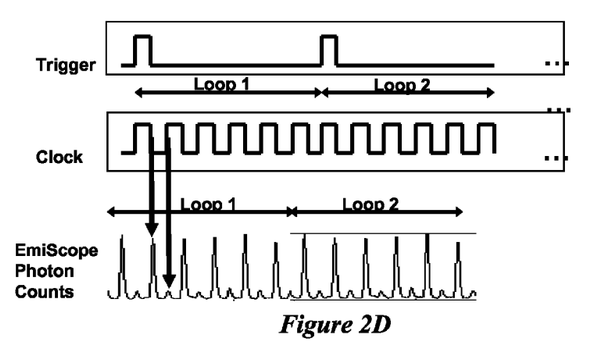
FIG. 2D is a plot of an example of the trigger signal, the clock signal, and photon emission count.

To perform the measurements, the test vector loop was repeated, so that the device response could be measured with statistically significant signal-to-noise. This is illustrated in FIG. 2D, showing as an example only two loops of the several loops that were repeated. In FIG. 2D the top plot is of the trigger signal over two loops, below it is the clock signal over the two loops, while below that is the plot of the accumulated time-resolved photon counts obtained by the TRE system 105. In FIG. 2D the high peaks are emissions from the nMOS, while the short peaks are emissions from the pMOS.

TRE Transition Information

The TRE system 105 acquired the optical transition information from two inverters, INV2 and INV17. The TRE system in this experiment (an EmiScope-I) had a relatively limited photon acquisition window of about 1 μs, so the data was acquired in 1 μs segments and then assembled to form a single timing acquisition window of 4 μs. FIG. 2B illustrates the Gaussian emission peaks corresponding to the clock signal and FIG. 2C illustrates the Gaussian emission peaks corresponding to the Vdd modulation signal. As shown in FIG. 2B, inverter 2 emits prior to inverter 17, and the propagation delay can be measured by obtaining TRE histograms from the two inverters in succession. As illustrated by FIG. 2C, the peaks produced by inverter 2 and inverter 17 are separated by a delay which depends on the time-varying bias voltage, i.e., higher $V_{dd}$ resulted in shorter propagation delay.

Figure 4:
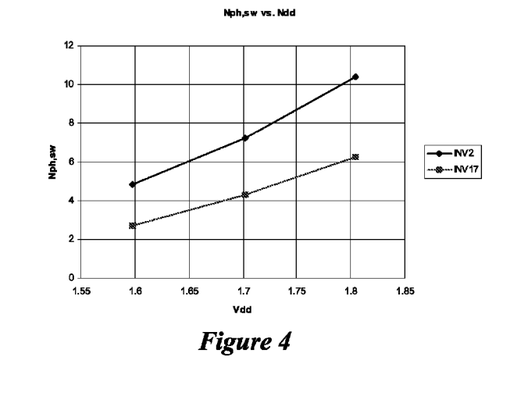
FIG. 4 shows the average amplitude of the photon emission from two inverters, INV2 and INV17, the $2^{nd}$ and $17^{th}$ inverters in the inverter chain, at different bias voltages Vdd.
Figure 5:
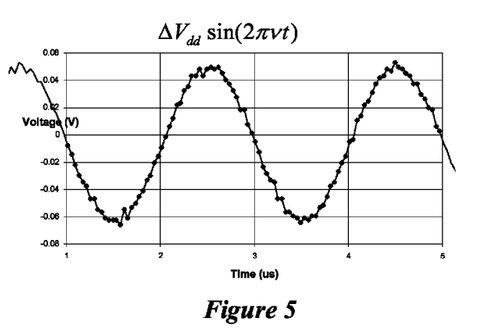
FIG. 5 shows Vdd (AC-coupled) as a function of time.

FIG. 4 shows the average amplitude of the photon emission from two inverters, INV2 and INV17, the $2^{nd}$ and $17^{th}$ inverters in the inverter chain, at different bias voltages Vdd. This plot may be used for calibration, as it is approximately linear. FIG. 5 shows Vdd (AC-coupled) as a function of time, as measured electrically for reference purposes.

Figure 6A:
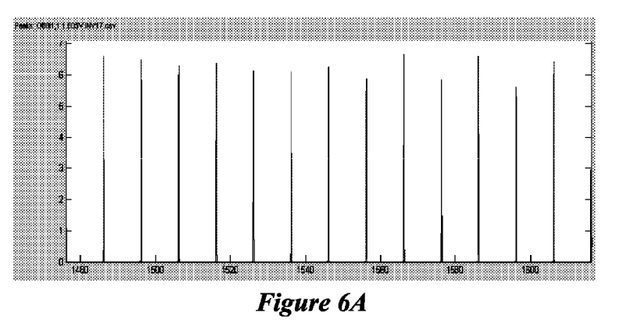
Figure 6B:
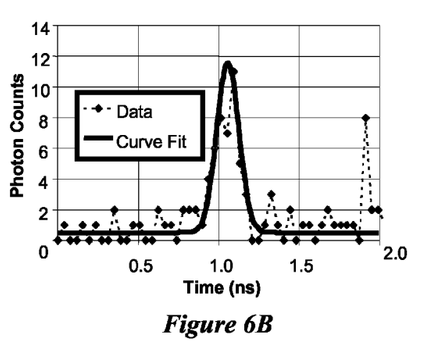
FIG. 6B is a plot of a single Gaussian curve fitted to data acquired on INV2.

A close-up view of the optical data Gaussian peaks is shown in FIG. 6A. Sample data for a single peak and a Gaussian curve fit for inverter 2 is shown in FIG. 6B. To obtain a statistically meaningful result, 400 such data peaks were used in one data set. The full set of data for INV2 and INV17 are show in FIG. 7 and FIG. 8. The 50 kHz, 110 mV p-p modulation signal on Vdd produced a perturbation of the local voltage on the DUT. This voltage perturbation induced both TRE amplitude variation as well as variation in the propagation delay between INV2 and INV17. FIG. 9 is a plot of the TRE peak amplitudes vs. time on INV2 and INV17. The modulation of the peak height is caused by the voltage modulation.

Measuring $\Delta V_{dd}$ from TRE Data

Fitting linear functions found in FIG. 4 to the photon emission curves Error! Reference source not found. yields the following relationship between the peak heights Nph,sw and the supply voltage Vdd.

On *INV*2, $$N_{ph,sw}^{INV2}(V_{dd}) = 26.9 V_{dd} - 38.3$$

On *INV*17, $$N_{ph,sw}^{INV17}(V_{dd}) = 17.0 V_{dd} - 24.6$$

Solving for $V_{dd}$ on *INV*2, $$V_{dd} = \frac{N_{ph,sw}^{INV2}(V_{dd})}{26.9} + 1.42,$$

And on *INV*17

$$V_{dd} = \frac{N_{ph,sw}^{INV17}(V_{dd})}{17.0} + 1.45$$

Applying these linear transformations to the emission amplitudes allows converting the TRE-measured photon emission signals into Vdd at the transistor. That is, once the photon count is calibrated to the voltage changes, the voltage Vdd can be obtained non-invasively using optical means without loading the circuit. Most notably, there is no need to mill into the DUT to reach a contact point and there is no need to have mechanical ohmic contact, thereby avoiding electrically loading the circuit and potentially changing its response.

Figure 7:
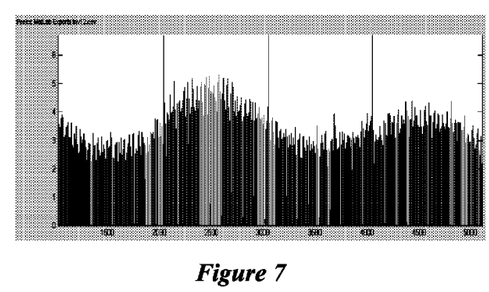
FIG. 7 is a plot of the full set of data for INV2.
Figure 8:
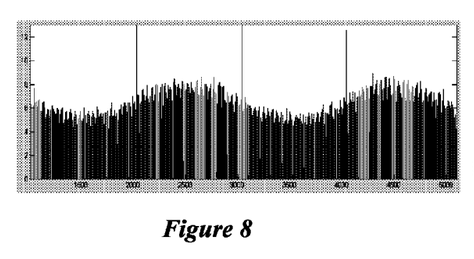
FIG. 8 is a plot of the full set of data for INV17.
Figure 9:
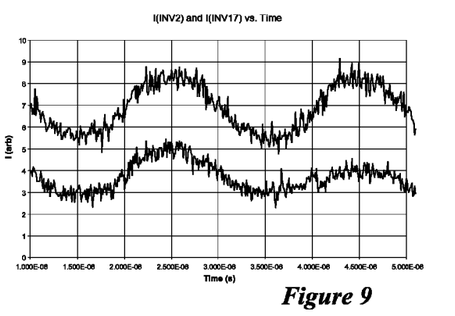
FIG. 9 is a plot of the TRE peak amplitudes vs. time on INV2 and INV17.
Figure 10:
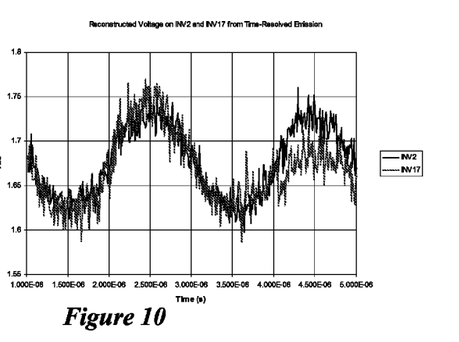
FIG. 10 is a plot of reconstructed Vdd from TRE data at INV2 and INV17.

FIG. 10 is a plot of reconstructed Vdd from TRE data at INV2 and INV17, i.e., FIG. 10 shows the result of applying the photon-to-voltage conversion to the TRE data in FIGS. 7 and 8. The two curves are in very good agreement. The amplitude of Vdd measured by TRE is 120 mV compared to the 110 mV measured electrically with the contact probe. The RMS noise on the amplitude of the emission at 1.7V on INV2 was ~0.5 which corresponds to 16 mV RMS.

Measuring Time Perturbations from TRE Data

Figure 11:
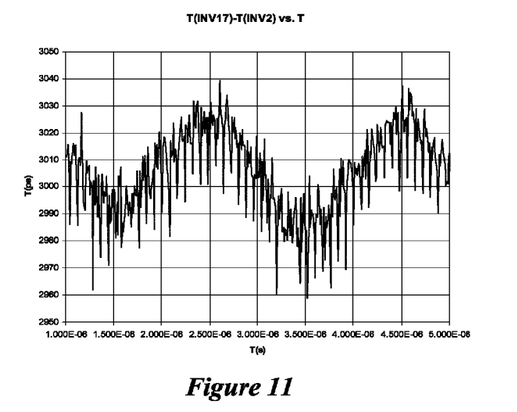
FIG. 11 is a plot showing inverter time delay T(INV17)−T(INV2) vs. time.

FIG. 11 shows the propagation delay between INV2 and INV17 as measured by the TRE system (i.e., the time separation of corresponding peaks in the emission waveforms of inverters 2 and 17). To find the propagation delay for each switching event the peak timing position at inverter 2 was subtracted from the corresponding position at inverter 17. The propagation delay between INV2 and INV17 was modulated by the voltage modulation on Vdd. The negative-going peaks are the result of measuring the time delay between opposite edges (leading and trailing) of the pulse train. This causes the pulse-width variation inherent in the function generator to be measured along with the variation due to voltage changes.

Figure 13:
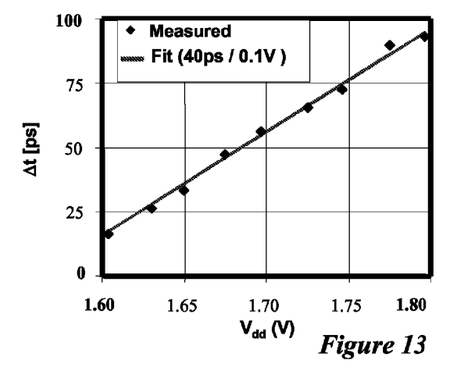
FIG. 13 illustrates a plot for calibration of Vdd vs. dt.

The measurement from FIG. 11 yielded about 40 ps delay, for peak to peak perturbation of about 100 mV. Similarly, from Vdd vs. dt calibration shown in FIG. 13, the expected delay from the voltage perturbation is also about 40 ps, which is in good agreement with the non-invasive method of the invention. The bandwidth of this measurement is limited by the period emission peaks, which act as a voltage sampling mechanism. The bandwidth of the measurement is twice the period of the emission peaks, which for the particular example shown here was 20 ns, or 50 MHz.

As can be understood from the above description, according to embodiments of the invention, time-resolved emission can be used to measure loop-synchronous, small-signal voltage perturbation in integrated circuits. The compelling advantage of this technique is that the measurements are completely non-invasive and so reflect the true device behavior. The TRE-measured voltage modulation signal is in reasonable agreement with the electrically-measured voltage modulation signal. The time-dependant propagation delay caused by Vdd modulation also shows the expected qualitative signature. This technique should find applications in circuits with relatively fast clock-like circuits where loop-synchronous voltage pickup is limiting circuit behavior.

Finally, it should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention. For example, the described methods and systems may be implemented in a wide variety of programming or scripting languages, such as Assembler, C/C++, perl, shell, PHP, Java, etc.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A system for measuring local voltage variation in an integrated circuit and related device response, comprising:
   a non-contact sensor for non-invasively acquiring a plurality of transition events from an integrated circuit and providing a transition events signal; and
   a processor programmed to receiving the transition events signal and perform the following operations:
   fitting a mathematical curve to the transition events signal;
   recording and measuring the positions in time, durations, and amplitudes of each peak in the curve, wherein each peak correspond to one of the transition events; and calculating the device response using at least one of the time, durations, and amplitude of a plurality of the transition events.

2. The system of claim 1, wherein the non-contact sensor comprises a photon sensor.

3. The system of claim 2, wherein the non-contact sensor operates to acquire a plurality of transition events from two selected devices of the integrated circuit physically separated from each other and to provide a first and a second transition events signals, and wherein the processor is further programmed to calculate time perturbation in the integrated circuit using differences in position in time of the peaks of curves of the first and second transition events signals.

4. The system of claim 1, wherein the non-contact sensor comprises an emission detection system.

5. The system of claim 1, wherein the non-contact sensor comprises a laser voltage probe.

6. The system of claim 1, wherein the mathematical curve comprises a Gaussian curve.

7. The system of claim 1, wherein calculating the device response, comprises applying linear transformations to the amplitude of a plurality of the transition events to thereby obtain Vdd at the integrated circuit.

8. A system for measuring local voltage variation and synchronous timing perturbation of propagation delay induced by the local voltage variation in an integrated circuit comprising a first device and a second device physically separated from each other, the system comprising:
- a non-contact emission detection system that is configured to detect a first photon emission signal from the first device and a second photon emission signal from the second device obtained during corresponding transition events occurring in response to a known time-varying bias voltage and a stimulating test vector applied repeatedly to the devices over a period of time;
- a processor configured to extract local voltage variation calibration data from a peak amplitude variation of at least one of the first photon emission signal and the second photon emission signal, and to extract timing perturbation calibration data from a timing difference between respective peak amplitude positions in the first photon emission signal and the second photon emission signal, wherein a peak amplitude corresponds to a transition event; and
- a memory to store the local voltage variation calibration data and timing perturbation calibration data for future use during a subsequent measurement of local voltage variation and synchronous timing perturbation of propagation delay in the integrated circuit.

9. The system of claim 8, wherein the test vector comprises a clock signal and a trigger signal in each test vector loop, and wherein the test vector is phase locked with the time varying bias voltage.

10. The system of claim 8, wherein the integrated circuit comprises a plurality of inverters coupled together forming a chain of inverters, wherein the first device and the second device are two inverters in the chain.

11. The system of claim 8, wherein the local voltage variation calibration data is characterized by relatively higher peak amplitude of the respective photon emission signals corresponding to higher values of time-varying bias voltage, and relatively lower peak amplitude of the respective photon emission signals corresponding to lower values of time-varying bias voltage.

12. The system of claim 8, wherein the timing perturbation calibration data is characterized by relatively shorter propagation delay in the respective photon emission signals corresponding to higher values of time-varying bias voltage, and relatively longer propagation delay in the respective photon emission signals corresponding to lower values of time-varying bias voltage.

13. The system of claim 8, wherein the peak amplitude value used by the processor is an average peak amplitude value obtained from a plurality of successive peaks in the respective photon emission signals.

* * * * *